United States Patent
Lin et al.

(10) Patent No.: US 10,476,002 B2
(45) Date of Patent: Nov. 12, 2019

(54) METHOD FOR THERMALLY TREATING SEMICONDUCTOR STRUCTURE BEFORE SAVING DATA

(71) Applicant: MACRONIX INTERNATIONAL CO., LTD., Hsinchu (TW)

(72) Inventors: Yu-Yu Lin, New Taipei (TW); Feng-Min Lee, Hsinchu (TW); Po-Hao Tseng, Taichung (TW); Kai-Chieh Hsu, Taoyuan (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 15/690,353

(22) Filed: Aug. 30, 2017

(65) Prior Publication Data

US 2019/0067574 A1 Feb. 28, 2019

(51) Int. Cl.
*H01L 45/00* (2006.01)
*G11C 13/00* (2006.01)
*H05K 3/34* (2006.01)

(52) U.S. Cl.
CPC ...... *H01L 45/1641* (2013.01); *G11C 13/0069* (2013.01); *H01L 45/08* (2013.01); *H05K 3/3494* (2013.01); *G11C 13/0007* (2013.01); *G11C 13/0097* (2013.01); *G11C 2013/0083* (2013.01); *H01L 45/1233* (2013.01); *H01L 45/146* (2013.01); *H01L 45/147* (2013.01)

(58) Field of Classification Search
CPC ... H01L 45/1641; H01L 45/08; H01L 45/147; H01L 45/1233; H01L 45/146; H05K 3/3494; G11C 13/0007; G11C 13/0097; G11C 13/0069
See application file for complete search history.

(56) References Cited

U.S. PATENT DOCUMENTS

| | | | |
|---|---|---|---|
| 8,429,334 B2 | 4/2013 | Ou | |
| 8,716,690 B2 | 5/2014 | Kim et al. | |
| 8,975,610 B1 * | 3/2015 | Mathur | H01L 45/00 257/2 |
| 9,025,360 B2 | 5/2015 | Pramanik et al. | |
| 9,224,947 B1 | 12/2015 | Chang et al. | |
| 9,263,129 B2 | 2/2016 | Cabout et al. | |
| 2011/0084240 A1 | 4/2011 | Schell et al. | |
| 2014/0254240 A1 * | 9/2014 | Perniola | G11C 13/0007 365/148 |
| 2014/0355338 A1 * | 12/2014 | Perniola | G11C 13/0004 365/163 |
| 2014/0376309 A1 * | 12/2014 | Cheng | G11C 13/0069 365/163 |

FOREIGN PATENT DOCUMENTS

TW 201025468 A1 7/2010

OTHER PUBLICATIONS

TIPO Office Action dated Jan. 15, 2018 in Taiwan application (No. 106129962).

* cited by examiner

*Primary Examiner* — Jerome Leboeuf
(74) *Attorney, Agent, or Firm* — McClure, Qualey & Rodack, LLP

(57) ABSTRACT

A method for treating a semiconductor structure comprising memory devices is provided, wherein a forming process is conducted to initialize operation of the memory devices. The semiconductor structure is subjected to a forming thermal treatment, and step of saving data to the memory devices is performed after the forming thermal treatment.

13 Claims, 8 Drawing Sheets

METHOD FOR THERMALLY TREATING SEMICONDUCTOR STRUCTURE BEFORE SAVING DATA

BACKGROUND

Field of the Invention

The disclosure relates in general to a method for treating a semiconductor structure, and more particularly to a method for treating a semiconductor structure to improve data retention.

Description of the Related Art

Conductive bridge resistive random access memory (ReRAM) has drawn much interest recently because of its high On-Off ratio, high speed, and good scalability. A conductive bridge ReRAM typically includes a bottom electrode, a memory layer (such as silicon dioxide, $SiO_2$) formed on the bottom electrode and an ion supplying layer (i.e. a top electrode) formed on the memory layer. The ion supplying layer of chalcogenide, such as $Ge_2Se_2Te_5$ (GST) includes a source of metal ions such as copper. The copper reacts with the chalcogenide to form a Cu-GST compound which could rapidly release copper cations. In SET operation, a bias is applied to the cell which causes the copper cations to migrate into the memory layer and form the conducting filaments (CF) by a process like electro-deposition. When the conducting filaments have grown sufficiently to contact the memory layer, a low resistance state (LRS) is achieved. In RESET operation, the cell is reversed biased causing the copper in the conducting filaments (CF) to dissolve in the memory layer and diffuse back to the ion supplying layer. When the conducting filaments (CF) are broken, the high resistance state (HRS) is restored. The typical resistance switching characteristics of the CB ReRAM are carried out by electrolytic reactions that form (SET) and disrupt (RESET) the conductive filaments (CF) in the memory layer, respectively denoted as LAS and HRS.

Other types of ReRAMs which can be switched between the SET and RESET states are also known in the art. Take a transition metal oxide (TMO) ReRAM for example, the switching mechanism is based on the oxygen movement and re-distribution. The TMO ReRAM device includes a bottom electrode, a memory layer (i.e. containing the transition metal oxide material, such as $HfO_2$, $TaO_2$, $TiO_2$, ... etc), and a top electrode. In the operation, electrical treatment is applied on the device to move the oxygen (or move the oxygen vacancies) and to redistribute the oxygen concentration distribution to have a high resistance value or a low resistance value. For the SET operation, an oxygen vacancy filament is formed in the memory layer and results in a low resistance state; for the RESET operation, the conducting filament (the vacancy path) is ruptured and a high resistive thin film is formed in the device and result in a high resistance state.

In the fabrication, the ReRAM devices (ex: chips) will be mounted on a printed circuit board (PCB), wherein a soldering reflow process is typically for mounting the devices. In order to reduce the cost, the data is better to be written into the packaged chip before the packaged chip is mounted on the PCB. After soldering, the coding data in the memory devices need be maintained or keep sufficient memory window to recognize data 0/1 for meeting the requirements of the memory device (which means the coding data must be remained after the high-temperature soldering reflow process). Unfortunately, the coding data of the typical ReRAM devices would be easily lost at high temperature, such as 250° C.~260° C., during the soldering reflow process.

SUMMARY

The disclosure relates to a method for treating a semiconductor structure; especially for treating a semiconductor structure comprising plural memory devices for improving data retention of the memory devices after soldering reflow process.

According to one embodiment of the present disclosure, a method for treating a semiconductor structure is provided, comprising: providing the semiconductor structure comprising memory devices; conducting a forming process to initialize operation of the memory devices; subjecting the semiconductor structure to a forming thermal treatment; and saving data to the memory devices after the forming thermal treatment.

The disclosure will become apparent from the following detailed description of the preferred but non-limiting embodiments. The following description is made with reference to the accompanying drawings.

DETAILED DESCRIPTION

In the embodiments of the present disclosure, a method for treating a semiconductor structure, especially for treating a semiconductor structure (such as a wafer) comprising plural memory devices (such as resistive random-access memory (ReRAM)), is provided. According to the method of the embodiment, at least a forming thermal treatment is performed before saving data to the memory devices. The method with an additional thermal treatment applied after the (electrical) forming process and before data write to the memory devices, as disclosed in the embodiment, improves the retention properties of the memory devices to pass the soldering reflow process and enhance the long-term data retention. The method of one embodiment can be applied for stabilizing the SET state resistance; moreover, other embodied methods can be applied for further stabilizing the RESET state resistance.

The embodiments are provided hereinafter with reference to the accompanying drawings for elaborating the methods of the disclosure However, the present disclosure is not limited thereto. The descriptions disclosed in the embodiments of the disclosure such as treating condition of related steps, details and order of the applicable procedures are provided for illustration only, not for limiting the scope of protection of the disclosure. Also, it is noted that not all embodiments of the invention are shown. Modifications and variations can be made without departing from the spirit of the disclosure to meet the requirements of the practical applications. Thus, there may be other embodiments of the present disclosure which are not specifically illustrated. Thus, the specification and the drawings are to be regard as an illustrative sense rather than a restrictive sense.

Moreover, use of ordinal terms such as "first", "second", "third" etc., in the specification and claims to describe an element does not by itself connote any priority, precedence, or order of one claim element over another or the temporal order in which acts of a method are performed, but are used merely as labels to distinguish one claim element having a certain name from another element having the same name (but for use of the ordinal term) to distinguish the claim elements.

First Embodiment

Figure 1:
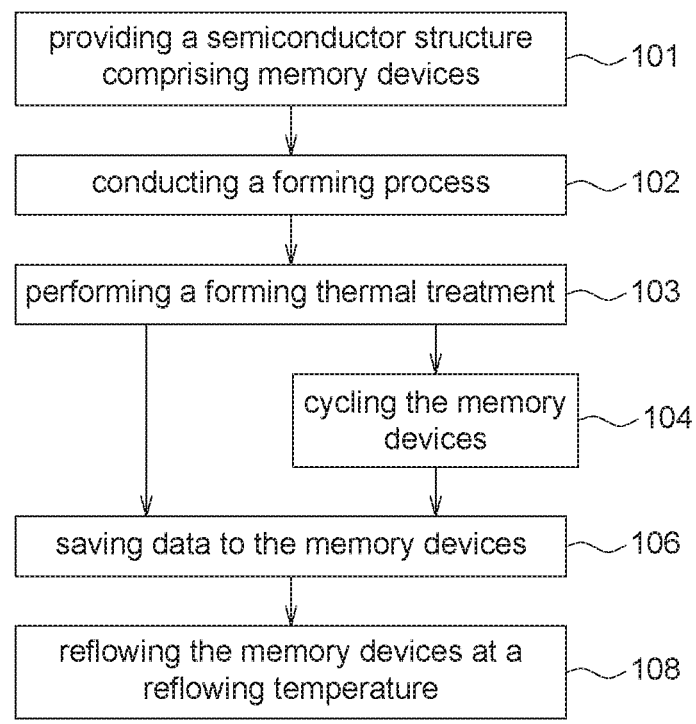
FIG. 1 is a flow diagram of a method for treating a semiconductor structure according to the first embodiment of the disclosure.

FIG. 1 is a flow diagram of a method for treating a semiconductor structure according to the first embodiment of the disclosure. In the first embodiment, a method for treating a semiconductor structure at least comprises providing a semiconductor structure (such as a wafer) comprising plural memory devices (such ReRAM))(step 101); conducting a forming process (step 102) to initialize operation of the memory devices; performing a forming thermal treatment (step 103)(for example, subjecting the semiconductor structure with the memory devices to the forming thermal treatment); and saving data to the memory devices (step 106) after the forming thermal treatment.

Moreover, in one embodiment, after the forming thermal treatment (step 103), the method may further optionally comprise electrical-cycling (i.e. between a low resistance state (LRS) and a high resistance state (HRS)) the memory devices (step 104) before saving the data.

Typically, the forming process (step 102) is operated by applying a forming voltage to initialize operation of the memory devices. During the forming operation, the defects are arranged into one or more continuous paths within the memory cell when a certain forming voltage is applied to electrodes thereof. Also, the step 106 of saving data to the memory devices can be referred as RESET/SET data coding. Thus, the step 106 would be referred as a data writing step hereinafter. Operation details of the forming process and RESET/SET data coding are known in the art and not redundantly repeatedly herein.

According to the method as disclosed in the first embodiment, the additional step of the forming thermal treatment could anneal the small filaments which be formed while the (electrical) forming process and focus the filaments to big one(s) for the following SET/RESET operation. In the first embodiment, the forming thermal treatment (step 103) can be performed at a temperature of about 200° C. to about 250° C. for a sufficient treatment time. In one example, a forming thermal treatment of the embodiment is performed at about 200° C. for a treatment time ranged from about 1 hour to about 100 hours. In another example, a forming thermal treatment of the embodiment is performed at about 250° C. for a treatment time ranged from about 1 minute to about 100 minutes. In one embodiment, a treatment time of the forming thermal treatment can be represented as:

$$10^{(8800/K)-16.82} < \text{treatment time} < 10^{(8800/K)-14.82},$$

wherein K is absolute temperature, and the unit of the treatment time is second(s). Noted that a longer treatment time might be determined if no damage occurs to degrade the cell function and performance, depending on the practical condition of the applications.

After saving the data to the memory devices (RESET/SET data coding), the method would further comprises reflowing the memory devices at a reflowing temperature (as shown in step 108 of FIG. 1) when the memory devices are mounted on the corresponding external printed circuit boards, or examined for checking the properties of the memory devices. Typically, the reflowing temperature for mounting the memory devices is about 250° C. to 260° C. In one example, a temperature of the forming thermal treatment of the embodiment is lower than the reflowing temperature as required. A transition metal oxide (TMO) ReRAM is taken for exemplification, and several related experiments are also conducted herein for investigating effects of the forming thermal treatment on the properties of the memory devices, and the results have proven that the memory devices treated by the forming thermal treatment of the embodiment have better data retention properties after reflow-examination at a high temperature.

Experiment 1

Figure 2:
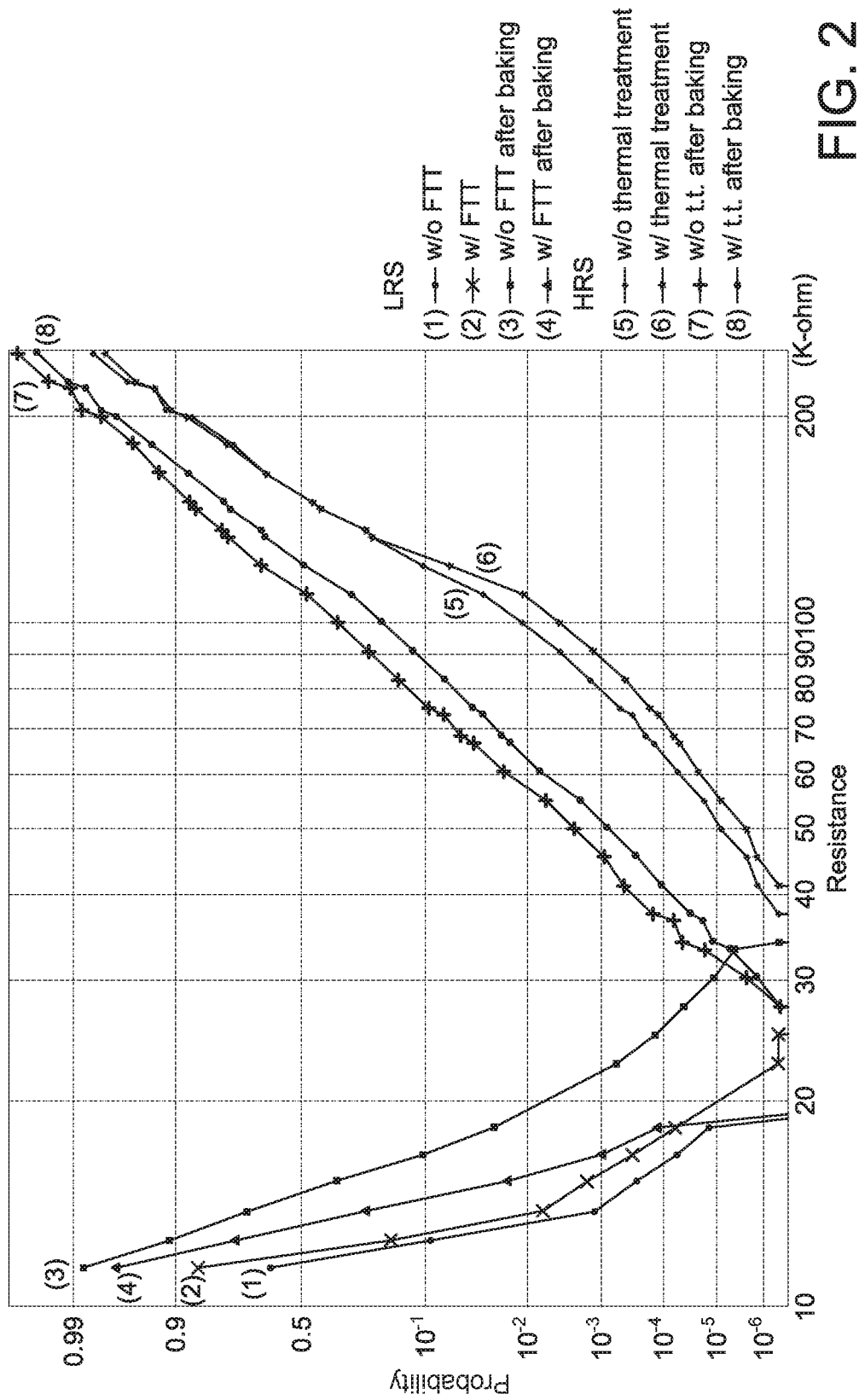
FIG. 2 shows the resistance changes of the memory devices with or without performing the forming thermal treatment (FTT) after reflow-examination at a high temperature.

Please refer to FIG. 2, which shows the resistance changes of the memory devices with or without performing the forming thermal treatment (FTT) after reflow-examination at a high temperature. In this experiment, the memory devices are examined at 250° C. for 7.5 minutes (which is slightly stronger than the typical soldering reflow process) three times. In FIG. 2, the curves 1-4 represent the resistances at the low resistance state (LRS) of the memory devices, and curves 1-4 and corresponding conditions of the memory devices tested in this experiment are summarized below:

Curve 1: a resistance curve of a conventional memory device without performing a forming thermal treatment (FTT) before RESET/SET data coding;

Curve 2: a resistance curve of an embodied memory device treated by FTT before RESET/SET data coding;

Curve 3: a resistance curve of the conventional memory device without performing a forming thermal treatment (FTT) after reflow-examination (ex: at 250° C. baking); and Curve 4: a resistance curve of the embodied memory device treated by FIT after reflow-examination (ex: at 250° C. baking).

After examining the samples of the memory devices at a baking temperature (ex: equal to a typical soldering reflow temperature, such as 250° C. for 7.5 minutes), the curves 1 and 2 are drifted to the positions of the curves 3 and 4, which means the resistances of the memory devices at the LRS would be increased after high-temperature soldering (whether a normal soldering reflow process or a reflow-examination as conducted in this experiment is applied to the memory devices). However, the results clearly indicated that at the low resistance state (LRS) of the memory devices, the resistance change (curve 2 drifted to curve 4) of the embodied memory device (treated by FTT before RESET/SET data coding) is smaller than the resistance change (curve 1 drifted to curve 3) of the conventional memory device (without performing FIT) after reflow-examination.

In FIG. 2, the curves 5-8 represent the resistances at the high resistance state (HRS) of the memory devices, and curves 5-8 and corresponding conditions of the memory devices tested in the this experiment are summarized below:

Curve 5: a resistance curve of a conventional memory device without performing a forming thermal treatment (FIT) before RESET/SET data coding;

Curve 6: a resistance curve of an embodied memory device treated by FIT before RESET/SET data coding;

Curve 7: a resistance curve of the conventional memory device without performing a forming thermal treatment (FIT) after reflow-examination (ex: at 250° C. baking); and Curve 8: a resistance curve of the embodied memory device treated by FTT after reflow-examination (ex: at 250° C. baking).

Similarly, after examining the samples of the memory devices at a baking temperature (ex: equal to a typical soldering reflow temperature, such as 250° C. for 7.5 minutes), the curves 5 and 6 are drifted to the positions of the curves 7 and 8, which means the resistances of the memory devices would be increased at the HRS after high-temperature soldering (whether a normal soldering reflow process or a reflow-examination as conducted in this experiment is applied to the memory devices). The results of curves 5-8 shows that at the HRS of the memory devices, the resistance change (curve 6 drifted to curve 8) of the embodied memory device (treated by FIT before RESET/SET data coding) and the resistance change (curve 5 drifted to curve 7) of the conventional memory device (without performing FIT) after reflow-examination have not much differences.

However, the resistances of the embodied memory device (treated by FTT before RESET/SET data coding) at the LRS and HRS after reflow-examination, a recognized region exists between the LRS and the HRS at a very low failure rate such as $10^{-5}$ probability (=10 ppm) for providing a sensing window. Please see the curve 4 (LRS) and the curve 8 (HRS) after baking. When a read operation is performed, the state of the memory device, more specifically, the resistive state of its resistance of the resistance switching layer can be sensed by applying a sensing voltage to its electrodes. The sensing voltage is sometime referred to as a read voltage $V_{read}$. Therefore, the forming thermal treatment of the embodiment improves the retention properties of the memory devices to pass the high-temperature soldering reflow process and enhance the long-term data retention of the memory devices.

Experiment 2

The experimental study as described in Experiment 1 (results presented in FIG. 2) is conducted for investigating effects of a forming thermal treatment according to the one embodiment on the resistance at the low resistance state (LRS) of the memory devices, wherein the device samples are treated by such as the steps 101, 102, 103, 106 and 108 in FIG. 1. Another experimental study is further conducted for investigating effects of the forming thermal treatment according to another embodiment on the low resistance state (LRS) for the memory devices circled between SET/RESET operations, wherein the device samples are treated by such as the steps 101, 102, 103, 104, 106 and 108 in FIG. 1.

Figure 3:
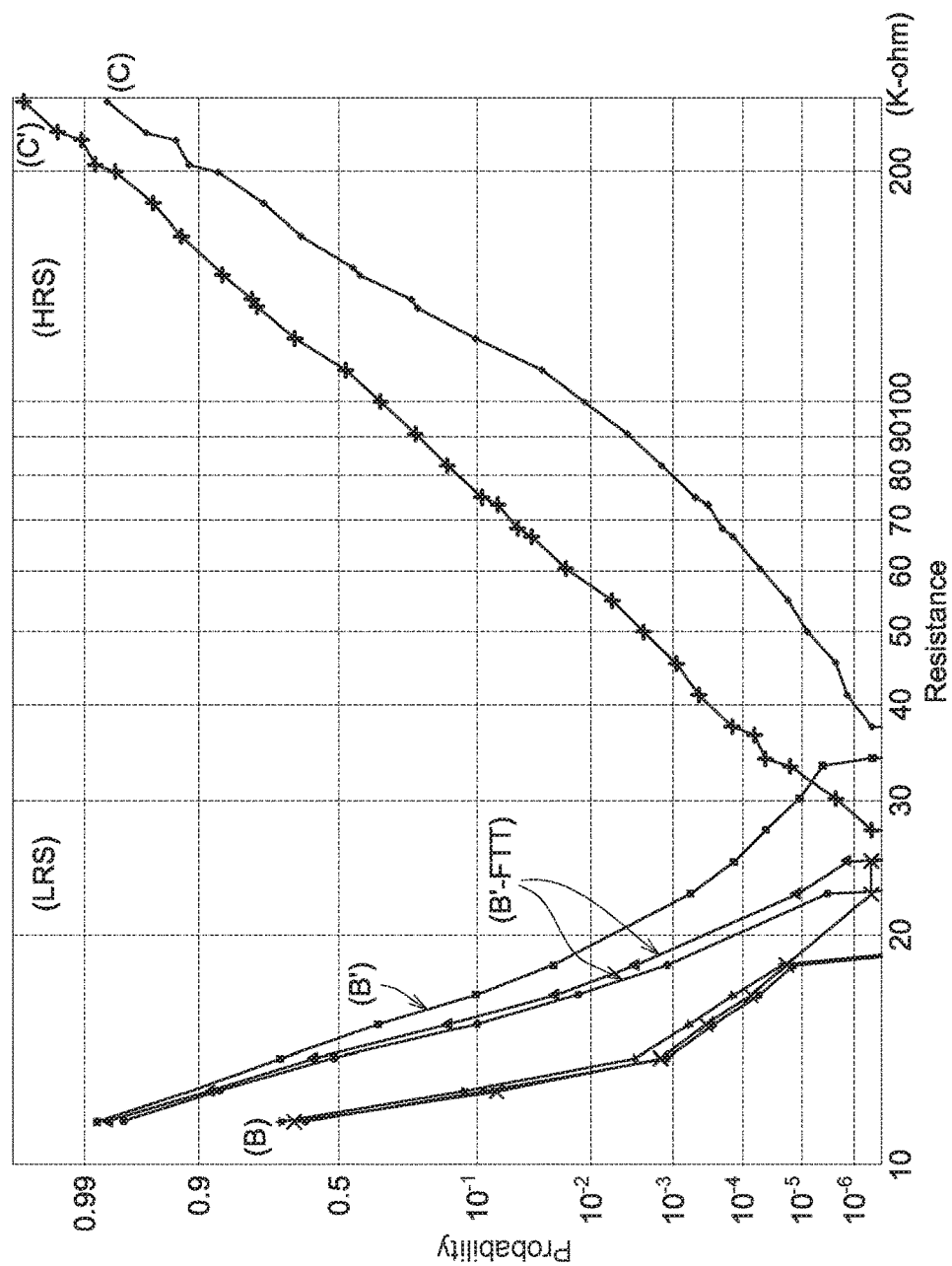
FIG. 3 shows the resistance changes of the memory devices with or without performing the forming thermal treatment (FTT) after reflow-examination at a high temperature, wherein the memory devices are circled between SET/RESET operations before reflow-examination.

Please refer to FIG. 3, which shows the resistance changes of the memory devices with or without performing the forming thermal treatment (FTT) after reflow-examination at a high temperature, wherein the memory devices are circled between SET/RESET operations before reflow-examination. In this experiment, the memory devices are examined at 250° C. for 7.5 minutes three times. In FIG. 3, the curves (B)(those three curves are plotted before reflow-examination), the curve (B') and curves (B'-FTT)(those three curves are plotted after reflow-examination) represent the resistances at the low resistance state (LRS) of the memory devices, and the corresponding conditions of the memory devices tested in this experiment are summarized below:

curves (B)—resistance curves of a conventional memory device without performing (FTT) and the embodied memory devices treated by FTT being circled respectively circled by three different operations:

(i) Forming operation+SET operation;

(ii) Forming operation+SET operation+FTT+RESET operation+SET operation; and (iii) Forming operation+RESET operation+FTT+SET operation.

Curves (B'): a resistance curve of the conventional memory device without performing FTT after reflow-examination (ex: at 250° C. baking).

Curve (B'-FTT): resistance curves of the embodied memory devices treated by FTT after reflow-examination (ex: at 250° C. baking).

Similarly, the curves (C) and (C') represent the resistances at the high resistance state (HRS) of the memory devices without FTT, before and after reflow-examination.

Results of curves (B) show that the resistances thereof are very similar before reflow-examination. After examining the samples of the memory devices at a baking temperature (ex: equal to a typical soldering reflow temperature, such as 250° C. for 7.5 minutes), the curves (B) are drifted to the positions of the curve (B') and the curves (B'-FTT), which means the resistances of the memory devices would be increased after high-temperature soldering. However, the results clearly indicated that at the low resistance state (LRS) of the memory devices, the less resistance change of the embodied memory device (treated by FTT before RESET/SET data coding) after reflow-examination can be achieved. Please see the curves (B) and the curves (B'-FTT).

Moreover, the results of the curves (B'-FTT) and the curve (C') after baking exists a recognized region the LRS and the HRS at a very low failure rate such as $10^{-5}$ probability (=10 ppm) for providing a sensing window. Therefore, the forming thermal treatment of the embodiment improves the retention properties of the cycle-operated memory devices to pass the high-temperature soldering reflow process and enhance the long-term data retention of the memory devices.

Figure 4A:
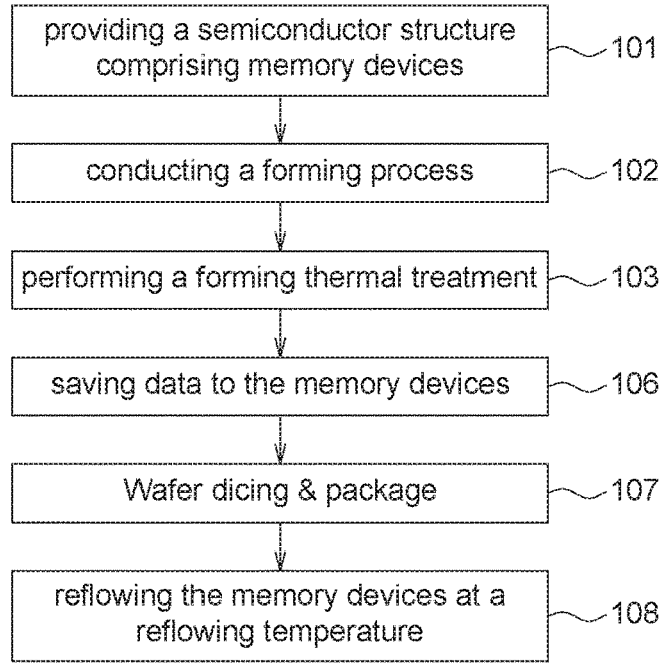
FIG. 4A and FIG. 4B show two flows for fabricating a semiconductor structure.
Figure 4B:
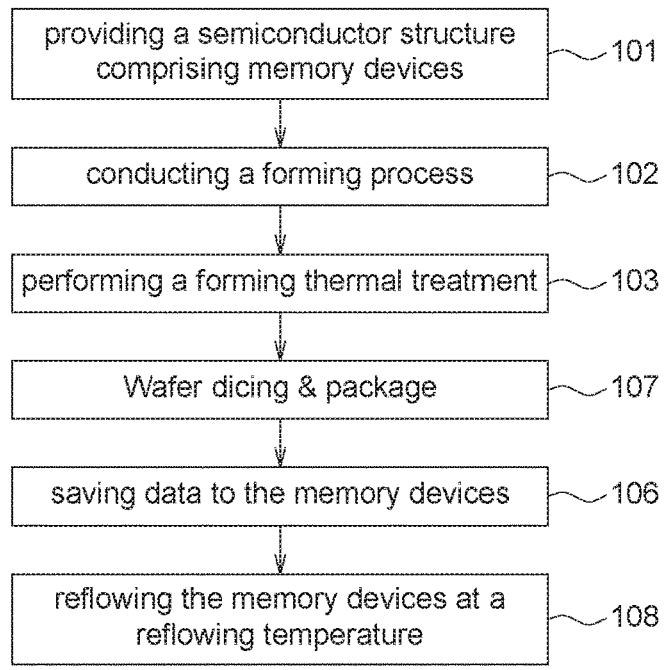

It is noted that the temperature and the treatment time of the forming thermal treatment of the embodiment can be modified or changed depending on the practical condition of the applications. For example, the overall thermal accumulation in the fabrication of the semiconductor structure/memory devices before data writing can be considered to modify the conditions of the forming thermal treatment. Please refer to FIG. 4A and FIG. 4B, which show two flows for fabricating a semiconductor structure. Please also refer to FIG. 1. Steps of FIG. 4A and FIG. 4B identical to steps of FIG. 1 are denoted as the same reference numbers, and the details are not redundantly repeated. The flow differences between FIG. 4A and FIG. 4B is the order of step 106 (saving data to the memory devices) and step 107 (wafer dicing and package). If the data writing step is performed after the wafer dicing and package flow, as shown in FIG. 4B, the total thermal accumulation from the forming thermal treatment (step 103) and the wafer dicing and package (step 107)(steps 103 and 107 are conducted between the electrical forming process and data write) should be calculated, so that the conditions of the forming thermal treatment (step 103), such as temperature and/or treatment time, would be reduced.

Second Embodiment

In the first embodiment, a forming thermal treatment performed before RESET/SET data coding is applied for stabilizing the SET state resistance. In the second embodiment, besides the forming thermal treatment as disclosed in the first embodiment, the method further comprises a RESET thermal process applied for stabilizing the RESET state resistance.

According to the second embodiment, a SET dummy baking (i.e. the forming thermal treatment of the first embodiment) and a RESET thermal process are performed after the (electrical) forming operation and before data writing (i.e. RESET/SET data coding).

Figure 5:
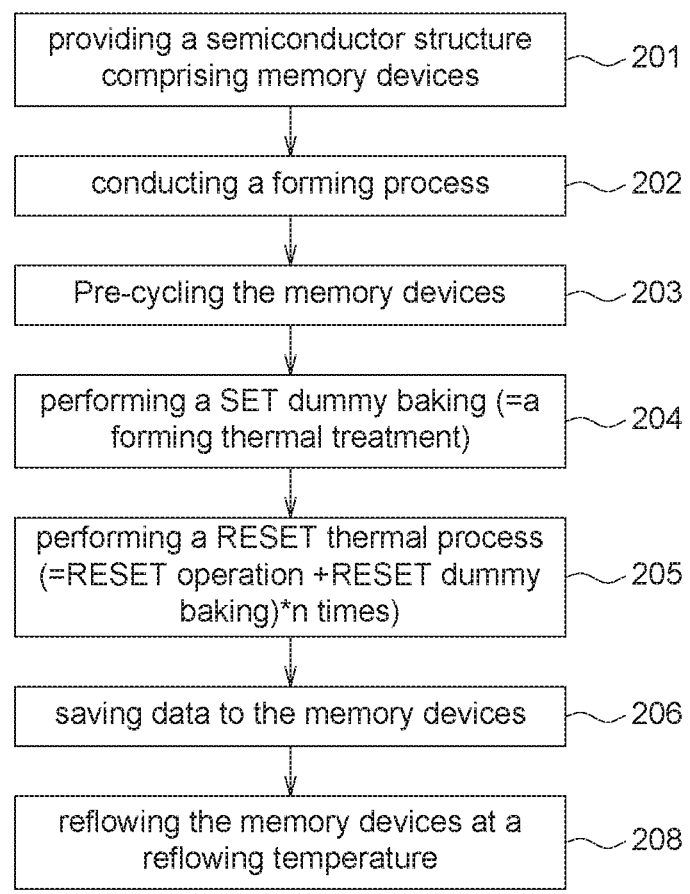
FIG. 5 is a flow diagram of one method for treating a semiconductor structure according to the second embodiment of the disclosure.

FIG. 5 is a flow diagram of one method for treating a semiconductor structure according to the second embodiment of the disclosure. In FIG. 5, a method for treating a semiconductor structure of the second embodiment comprises: providing a semiconductor structure comprising plural memory devices (step 201); conducting a forming process (step 202) to initialize operation of the memory devices; pre-cycling the memory devices (step 203; such as electrical-cycling between LRS and HRS of the memory devices in step 104 of FIG. 1); performing a SET dummy baking (step 204; could be referred as the forming thermal treatment of the first embodiment); performing a RESET thermal process (step 205); saving data to the memory devices (step 206; such as RESET/SET data coding); and reflowing the memory devices at a reflowing temperature (step 208; when the memory devices are mounted on the corresponding external printed circuit boards, or examined for checking the properties of the memory devices).

Treatment details including temperature and treatment time of the SET dummy baking (step 204) of the second embodiment can be referred to the descriptions of the forming thermal treatment in the first embodiment, which are not redundantly repeated.

In the second embodiment, the RESET thermal process (step 205) can be performed at a temperature of 150° C. to 250° C. for a sufficient treatment time. In one embodiment, the RESET thermal process is performed for a treatment time ranged from about 5 mins to 10 hours. In one embodiment, a treatment time of the RESET thermal process can be represented as:

$$10^{(8800/K)-16.82} < \text{treatment time} < 10^{(8800/K)-14.82},$$

wherein K is absolute temperature, and the unit of the treatment time is second(s). Similarly, a longer treatment time might be determined if no damage occurs to degrade the cell function and performance, depending on the practical condition of the applications.

In the second embodiment, step 205 of performing a RESET thermal process may comprise repeatedly performing following steps n times: (1) performing a RESET operation; and (2) performing a RESET dummy baking; wherein n=1 or n≥2, and n is positive integer. For example, the semiconductor structure or at least one of the memory devices thereof is subjected to the RESET dummy baking, which is also a thermal treatment (ex: 150° C. to 250° C.).

In one embodiment, n is equal to 1. One set of RESET operation and a RESET dummy baking could enhance the stability of RESET state resistance. A flow of the second embodiment, by performing one set of (1) RESET operation and (2) a RESET dummy baking, can be simply presented as EXPRESSION (1) below:

Forming→Pre-cycling RESET/SET process (ex: R/S/R/S/R/S)→SET Dummy baking→RESET→Reset Dummy baking 1→Reset state coding→Set state coding→Soldering (ex: temperature>250° C.).     EXPRESSION (1), wherein "R" and "S" above are the abbreviations of RESET and SET operations.

In other embodiments, step 205 of performing a RESET thermal process may comprise more than one set of RESET operation and a RESET dummy baking. In one embodiment, n is equal to 3, for greatly improving the stability of RESET state resistance of the memory devices. A flow of the second embodiment, by performing three sets of (1) RESET operation and (2) a RESET dummy baking, can be simply presented as EXPRESSION (2) below:

Forming→Pre-cycling RESET/SET process (ex: R/S/R/S/R/S)→SET Dummy baking→RESET 1→Reset Dummy baking 1 (DB1)→RESET 2→Reset Dummy baking 2 (DB2)→RESET 3→Reset Dummy baking 3 (DB3)→Reset state coding→Set state coding→Soldering (ex: temperature>250° C.).     EXPRESSION (2)

Figure 6:
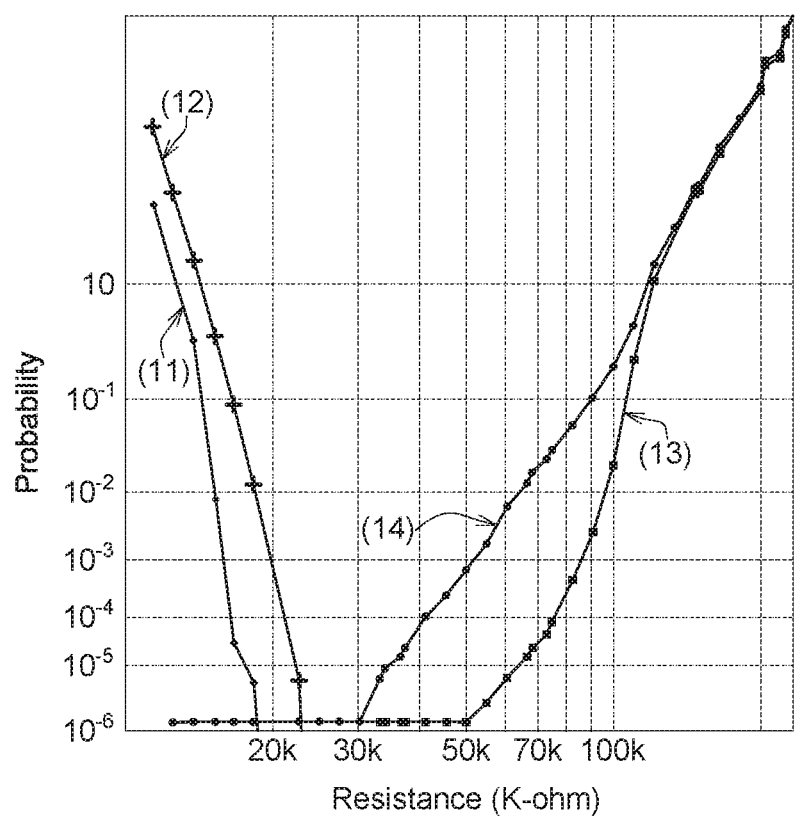
FIG. 6 shows the resistance changes of the memory devices treated with the method of the second embodiment after reflow-examination at a high temperature.

Related experiments are also conducted herein for investigating effects of a RESET thermal process on the properties of the memory devices. Please see FIG. 6, which shows the resistance changes of the memory devices treated with the method of the second embodiment after reflow-examination at a high temperature (ex: >250° C.). In this experiment, three sets of (1) RESET operation and (2) a RESET dummy baking are conducted in the embodied method. In FIG. 6, the curves (11) and (12) represent the resistances at the low resistance state (LRS) of the memory devices, and the curves (13) and (14) represent the resistances at the high resistance state (HRS) of the memory devices. Also, the curves (11) and (13) are the resistances of the memory devices before reflow-examination, while the curves (12) and (14) are the resistances of the memory devices after reflow-examination. The results in FIG. 6 have proven that the memory devices treated by a SET Dummy baking (i.e. the forming thermal treatment of the first embodiment) and a RESET thermal process have better data retention properties after reflow-examination at a high temperature, since a recognized region exists between the LRS and the HRS at a very low failure rate such as $10^{-5}$ probability (=10 ppm) for providing a sensing window (ex: about 13 k ohm), and even a recognized region (ex: about 7 ohm) exists at a failure rate of $10^{-6}$ probability (=1 ppm).

It is believed that SET dummy baking of the embodiment is used to fix main conduction filament and eliminated the branch of filament, thereby obtaining a stable SET state, and reducing the coding data loss of the SET state. Moreover, cells with filaments of weak rupture will induce severe coding data loss of the RESET state after soldering process. During RESET dummy baking of the embodiment, the cell(s) with filament(s) of weak rupture would be found and reset again; therefore, after RESET dummy baking, a stable RESET state is obtained, and the coding data loss of the RESET state is reduced.

Figure 7:
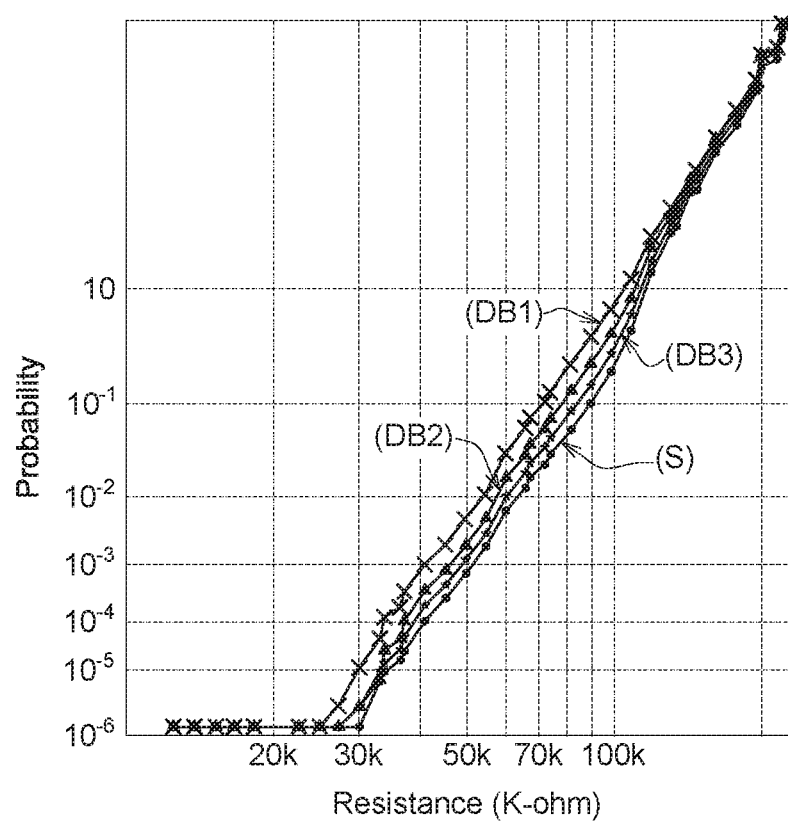
FIG. 7 shows the resistance of four curves obtained after Reset Dummy baking 1 (DB1), Reset Dummy baking 2 (DB2), Reset Dummy baking 3 (DB3) and reflow-examination (S), wherein the resistances have been increased with the times of baking.
Figure 8:
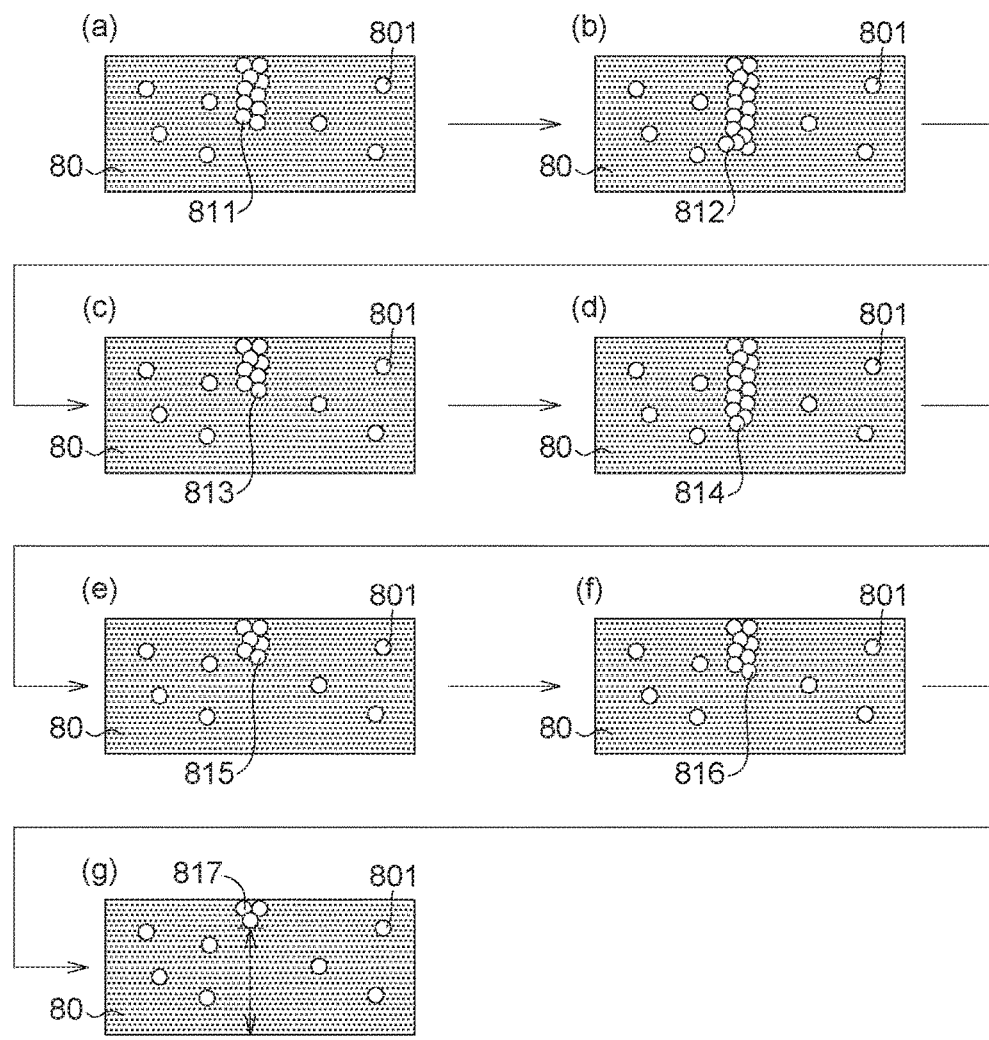
FIG. 8 schematically illustrates the structural changes of a memory cell at different operation steps.

As described above, the RESET operation can be implemented several times to build the filament rupture up. For example, after triple RESET dummy baking, the reset state becomes stronger and significantly suppresses the reset data loss after soldering. Please refer FIG. 7, FIG. 8, and also EXPRESSION (2) above. FIG. 7 shows the resistance of four curves obtained after Reset Dummy baking 1 (DB1), Reset Dummy baking 2 (DB2), Reset Dummy baking 3 (DB3) and reflow-examination (S), wherein the resistances have been increased with the times of baking. FIG. 8 schematically illustrates the structural changes of a memory cell at different operation steps. It is noted that the illustrations (a)-(g) merely show the structural changes in a resistive switching layer, and the top and bottom electrodes formed above and under the resistive switching layer as known in the art have been omitted. As shown in FIG. 8, in the RESET state (illustration (a)), the defects 801 (such as oxygen vacancy) are arranged into at least one continuous portion 811 within the resistive switching layer 80. During the reset dummy baking 1 (DB1; illustration (b)), the defects 801 are gathered to form a longer continuous portion 812 (i.e. the resistance decreased). After reset again (illustration (c)), the continuous portion 812 of illustration (b) breaks into a shorter continuous portion 813 (i.e. the resistance increased). During the reset dummy baking 2 (DB2; illustration (d)), the defects 801 are reformed to build a continuous portion 814 (i.e. the resistance decreased). After reset again (illustration (e)), the continuous portion 814 of illustration (d) breaks into a shorter continuous portion 815 (i.e. the resistance increased). During the reset dummy baking 3 (DB3; illustration (f)), the defects 801 are reformed to build a continuous portion 816 (i.e. the resistance decreased). During the reset date coding (illustration (g)), the continuous portion 816 of illustration (f) breaks into a portion 817 (i.e. filament rupture), thereby possessing the highest resistance.

Thus, results of FIG. 7 and FIG. 8 show that the curve (5) (after the reflow-examination) shows the highest resistance and the curve (DB1) shows the lowest resistance at the same failure rate such as $10^{-5}$ probability. Accordingly, after dummy baking flow (such as SET Dummy baking and RESET Dummy baking) of the embodiment, the loss of coding data (SET/RESET) can be reduced and provided sufficient memory window for recognizing.

Additionally, at least two processing machines are adopted for performing the method of the embodiment. For example, the forming process can be performed at a first processing machine, and an additional thermal treatment applied before data writing according to the first and second embodiments can be performed at a second processing machine. In one embodiment, the second processing machine is capable of providing a heating temperature at least ranged from 150° C. to 250° C. or 200° C. to 250° C. Thus, in the applications, the semiconductor structure is disposed at the first processing machine for conducting the forming process and pre-recycling the memory devices, and then transmitted to the second processing machine for performing the SET/RESET dummy baking of the embodiment, and transmitted back to the first processing machine to performing SET/RESET data coding to the memory devices.

According to the aforementioned descriptions, after examining the samples of the memory devices at a baking temperature (ex: equal to a soldering reflow temperature), the experimental results show that the memory devices applied by the methods of the first and second embodiments have good data retention properties, since a recognized region exists between LRS and HRS at a very low failure rate such as $10^{-5}$ probability (=10 ppm) for providing a sensing window. The method of the first embodiment (i.e. an additional thermal treatment applied before data writing) can be applied for stabilizing the SET state resistance. Moreover, the method of the second embodiment (i.e. a SET thermal treatment and a RESET thermal process applied before data writing) can be applied for stabilizing not only the SET state resistance but also the RESET state resistance. The methods of the embodiments provide useful and non-expensive procedures, which are suitable for mass production, and also efficiently improve the electrical characteristics of the memory devices in the applications.

It is noted that the methods as described above are provided for illustration. The disclosure is not limited to the procedures disclosed above. Other embodiments with different conditions of known operations can be applicable, and the exemplified procedure details could be adjusted and changed according to the requirements and/or manufacturing steps of the practical applications.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method for treating a semiconductor structure, comprising:
   providing the semiconductor structure comprising memory devices;
   conducting a forming process to initialize operation of the memory devices;
   subjecting the semiconductor structure to a forming thermal treatment, wherein the forming thermal treatment is a SET dummy baking;
   subjecting at least one of the memory devices to a RESET thermal process after performing the SET dummy baking and before saving data to said at least one of the memory devices, wherein the RESET thermal process is performed at a temperature of 150° C. to 250° C.;
   saving data to said at least one of the memory devices; and
   reflowing said at least one of the memory devices at a reflowing temperature after saving data to said at least one of the memory devices.

2. The method according to claim 1, wherein the forming thermal treatment is performed at a temperature of 200° C. to 250° C.

3. The method according to claim 2, wherein a treatment time of the forming thermal treatment is represented as:

$$10^{(8800/K)-16.82} < \text{treatment time} < 10^{(8800/K)-14.82},$$

wherein K is absolute temperature, and the unit of the treatment time is second(s).

4. The method according to claim 1, wherein the forming process is performed at a first processing machine, and the forming thermal treatment is performed at a second processing machine.

5. The method according to claim 4, wherein the second processing machine is configured to provide a heating temperature at least ranged from 200° C. to 250° C.

6. The method according to claim 1, wherein the RESET thermal process is performed for a time ranged from 5 minutes to 10 hours.

7. The method according to claim 1, wherein a treatment time of the RESET thermal process is represented as:

$$10^{(8800/K)-16.82} < \text{treatment time} < 10^{(8800/K)-14.82},$$

wherein K is absolute temperature, and the unit of the treatment time is second(s).

8. The method according to claim 1, further comprising performing a pre-cycling RESET/SET process after the forming process and before the SET dummy baking.

9. The method according to claim 1, wherein the RESET thermal process comprises repeatedly performing following steps n times:
   performing a RESET operation; and
   performing a RESET dummy baking,
   wherein n≥2, and n is positive integer.

10. The method according to claim 9, wherein n is equal to 3.

11. The method according to claim 1, wherein the forming process is performed at a first processing machine, and the SET dummy baking and the RESET thermal process are performed at a second processing machine.

12. The method according to claim 11, wherein the second processing machine is configured to provide a heating temperature at least ranged from 150° C. to 250° C.

13. The method according to claim 1, wherein saving data to said at least one of the memory devices comprises a RESET state coding and a SET state coding.

* * * * *